United States Patent [19]
Voigt et al.

[11] Patent Number: 5,463,776
[45] Date of Patent: Oct. 31, 1995

[54] STORAGE MANAGEMENT SYSTEM FOR CONCURRENT GENERATION AND FAIR ALLOCATION OF DISK SPACE AMONG COMPETING REQUESTS

[75] Inventors: Douglas L. Voigt; Michael B. Jacobson, both of Boise, Id.

[73] Assignee: Hewlett-Packard Company, Palo Alto, Calif.

[21] Appl. No.: 311,615

[22] Filed: Sep. 22, 1994

[51] Int. Cl.⁶ ................................................ G06F 12/00
[52] U.S. Cl. .................... 395/600; 395/700; 395/800; 364/976.5; 364/DIG. 2; 364/970.4
[58] Field of Search ........................... 395/600, 575, 395/650, 700, 250, 425, 800

[56] References Cited

U.S. PATENT DOCUMENTS

| | | | |
|---|---|---|---|
| 4,528,624 | 7/1985 | Kamionka et al. | 395/650 |
| 4,603,382 | 7/1986 | Cole et al. | 395/250 |
| 5,109,336 | 4/1992 | Guenther et al. | 395/425 |
| 5,155,835 | 10/1992 | Belsan | 395/425 |
| 5,195,100 | 3/1993 | Katz et al. | 371/66 |
| 5,237,658 | 8/1993 | Walker et al. | 395/200 |
| 5,247,634 | 9/1993 | Cline et al. | 395/425 |
| 5,247,638 | 9/1993 | O'Brien et al. | 395/425 |
| 5,278,838 | 1/1994 | Ng et al. | 371/10.1 |
| 5,287,462 | 2/1994 | Jibbe et al. | 395/275 |
| 5,289,418 | 2/1994 | Youngerth | 365/201 |
| 5,301,288 | 4/1994 | Newman et al. | 395/400 |
| 5,307,473 | 4/1994 | Tsuboi et al. | 395/425 |

*Primary Examiner*—Thomas G. Black
*Assistant Examiner*—Cuan Pham

[57] ABSTRACT

A computer storage management system responds to a recognition of an insufficiency of disk storage space available by converting inefficiently used storage space to efficiently used space and free space. The management system controls allocation of storage space to storage space consumers pursuant to an allocation ordering scheme which ensures fairness of storage space consumption among competing consumers. Generation of free storage space and allocation of space are substantially concurrent events, creating a continuous flow of space generation and space consumption. Storage space is consistently kept and used in an efficient manner, and competing processes are allocated storage space fairly and effectively.

20 Claims, 2 Drawing Sheets

STORAGE MANAGEMENT SYSTEM FOR CONCURRENT GENERATION AND FAIR ALLOCATION OF DISK SPACE AMONG COMPETING REQUESTS

FIELD OF THE INVENTION

This invention relates, in general, to computer data storage management and, in particular, to a disk management system and method for substantially concurrently generating and allocating free disk space from inefficiently used disk space for disk space consumers.

BACKGROUND OF THE INVENTION

In the computer industry, memory devices, such as hard and floppy disk drives and Random Access Memory (RAM), provide a common means for storing computer information. Typically, space is allocated in and data is stored to and retrieved from these storage mediums through hardware and software adapted for that purpose. For example, a computer operating system will often provide the necessary interface with a user or process ("Process") for accessing the storage medium to retrieve data, delete data, or to allocate free space for storing new data therein.

Often, when data is written to a disk drive, it is written and stored in an inefficient manner. For example, when data is to be saved to the disk, the interfacing Process will seek out a storage space location on the disk that is available and free to be used (i.e., not already occupied with existing data or reserved for some purpose), and the data is written to that identified available location. However, if more contiguous storage space is required than is available on the disk in one contiguous location, an insufficient disk space error may occur. Consequently, the Process attempting to consume disk space (write the data to disk) is unable to satisfy its request and must wait until more contiguous disk space becomes available. An insufficient amount of contiguous space may be the result of the disk space having become fragmented. As a storage medium continues to be used, it can easily become quite fragmented so that no large contiguous block of storage space is available. In this context, fragmentation constitutes inefficiently used disk space when a sufficient amount of contiguous disk space is unavailable to satisfy a consumption request.

Another example of inefficient use of storage space in a storage medium is data stored in a non-compressed format. Data stored on disk in a compressed format consumes less disk space and represents a more efficient use of disk space. Since disk capacity is always a limited amount, data compression is a desirable feature.

Yet another instance of inefficient use of storage space is seen in the comparison of the amount of redundant data stored in various data protection schemes. For example, where a plurality of storage mediums are used, such as in a Redundant Array of Independent Disks (RAID or disk array), the use of disk mirroring (RAID Level 1) and parity checking (RAID Level 5) data redundancy protection schemes are commonly employed. Although RAID 1 provides the highest data reliability and typically provides the best Input/Output (I/O) performance, it uses the most amount of storage space because all data is duplicated. In contrast, although RAID 5 provides a lesser amount of data reliability and, typically, reduced I/O performance, it doesn't consume as much disk space as a RAID 1 technique because data is not duplicated but rather parity checked across the disk array. Accordingly, literal disk storage space is, effectively, used more efficiently in a RAID 5 technique compared to a RAID 1 method.

Several problems arise with data being stored inefficiently on disk drives and other storage mediums. First, some requests for space cannot be satisfied with fragmented free space. Second, non-compressed data takes up more disk space than compressed data, and certain data redundancy techniques take up more disk space than others, thus limiting the total amount of data capable of being stored on the disk. Third, separate processing must occur to convert inefficiently stored data to more efficiently stored data in order to create more usable free disk space from the limited amount of existing space. Fourth, when substantially concurrent Processes request the consumption of disk space and data is stored inefficiently on the disk or free space is being generated concurrently on the disk, there exists the potential for an unfair consumption of disk space by one of the Processes over the other.

As an example, assume that a first Process requests to consume disk space but is unable to allocate its required amount because insufficient disk space exists to satisfy its request. The insufficient disk space may be the result of any number of the inefficiencies in disk space usage discussed. Assume also that a second Process contends for consumption of disk space substantially concurrently with but immediately after the first Process has made its request. Assume also, then, that space is made available by some means after the first Process makes its request but substantially concurrently with the second Process making its request. This space may be made available by any means discussed, such as deletion of data from the disk, compression of data on the disk, or any other conceivable means for freeing up disk space. At the instant that the space is made available, it is possible that the second Process will consume the disk space before the first Process because the second Process requested the space at substantially the same time the space became available. Consequently, the second Process allocates and consumes the free space before the first Process is able to allocate its requested amount, even though the first Process was first in time to request space. In essence, a contention for space occurs, and the second Process unfairly consumes the space relative to the first Process.

This example demonstrates the problem of unfair allocation of disk space by a Process when multiple Processes contend for disk space, insufficient disk space exists to satisfy the disk space consumption requests, and the generation of free space from inefficiently used space is an event that needs to occur to provide more usable disk space.

Although efforts have been made to address these problems, a completely satisfactory solution has not been presented. For example, certain software utilities have been developed to defragment a hard disk drive. However, generally these utilities do not work concurrently with Processes requesting disk space usage but must be executed at discrete moments when no other disk activity is occurring. Other utilities compress data on a disk drive, and some even work concurrently with Process activity in consuming disk space, but none work in conjunction with the other disk space inefficiency problems. Furthermore, although various RAID techniques are available for data redundancy use, the facility to alternate between the techniques upon a concurrent demand for disk space has not been offered in conjunction with the other disk space inefficiency problems. In essence, nothing in the art provides a comprehensive solution to manage each of the aforementioned disk space inefficiencies concurrently during Process contention for disk space and, yet, also ensures a fair disk space consumption by the requesting Processes.

Accordingly, objects of the present invention are to provide a memory management system wherein responsive to a recognized need for more storage space and responsive to Process requests for storage space consumption in a limited storage space environment, inefficiently used storage space is converted to efficiently used storage space and free space, and competing Processes are allowed to allocate free storage space only pursuant to an ordering control scheme conveying elements of fairness for allocation of the free space.

SUMMARY OF THE INVENTION

According to principles of the present invention in its preferred embodiment, a disk management system generates free disk storage space and, concurrently, controls allocation of the free space generated and other usable space among contending Process consumers. The system responds to a recognized need for more storage space in a limited storage space environment by converting inefficiently used disk space to efficiently used disk space and free space, and controls Process consumers contending for disk space pursuant to an ordering scheme to ensure fairness of disk space consumption among the consumers. The generation of free storage space and the control of the allocation of free space are substantially concurrent events, creating a continuous flow of space generation and space consumption. Advantageously, storage space is consistently kept and used in an efficient manner, and competing Processes are allocated storage space fairly and effectively.

Other objects, advantages, and capabilities of the present invention will become more apparent as the description proceeds.

DETAILED DESCRIPTION OF THE INVENTION

Figure 1:
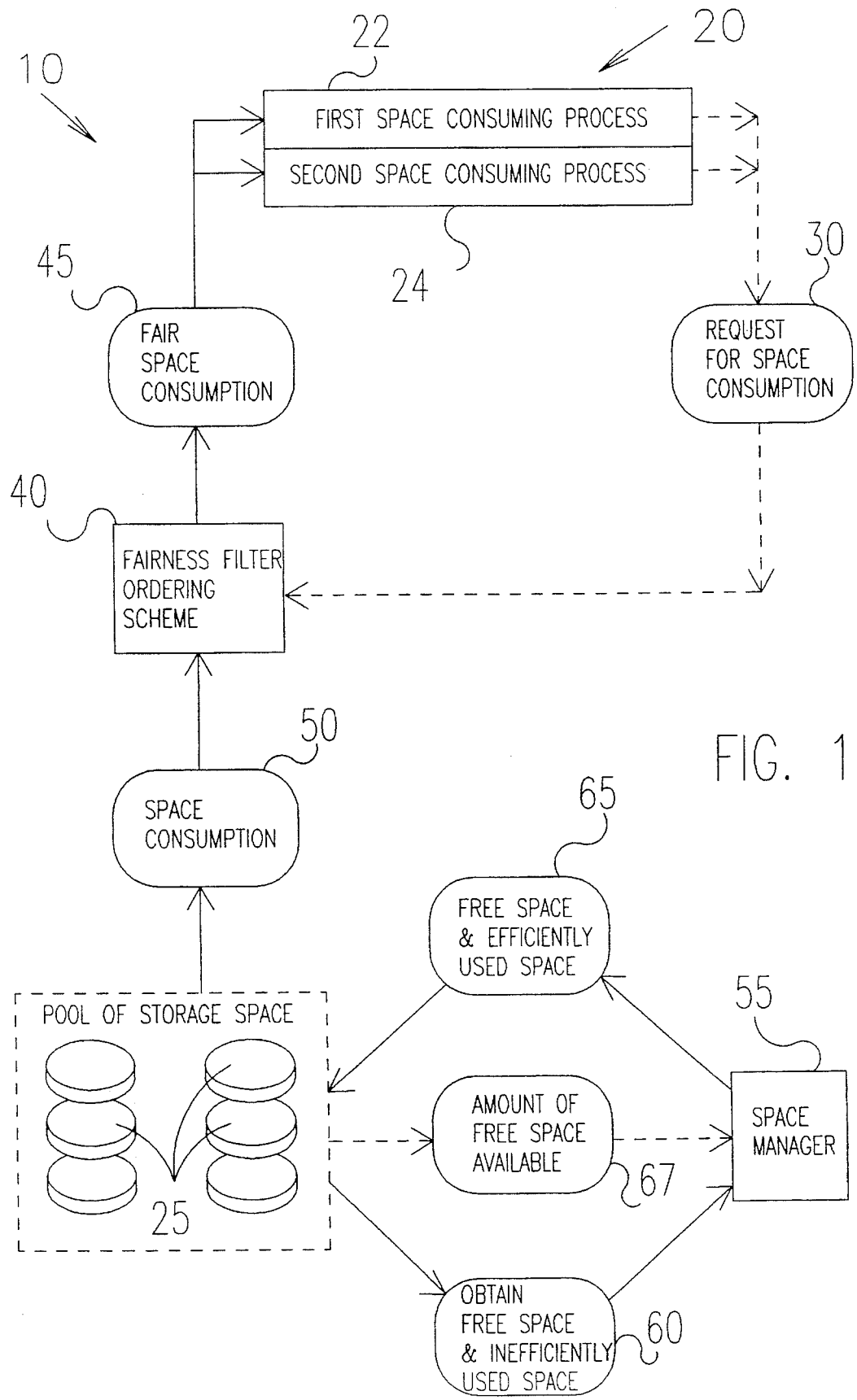
FIG. 1 is a flow diagram representing an overview of the present invention storage management system and method.

FIG. 1 is a flow diagram representing an overview of the present invention storage management system 10. Although the following description focuses on disk storage space management and use, it is not intended to limit the applicability of the invention to disk storage alone, as it is obvious that the concepts and features are equally applicable to other storage mediums, such as Random Access Memory (RAM).

In this diagram, the boxes represent processes in the system, the ovals represent a labeling of the directional arrows, the solid directional arrows represent the flow of disk space, and the dashed directional arrows represent the flow of control information concerning what needs to be done with the disk space.

First and second space consuming processes 20 represent typical processes executing in a computer system that need to consume disk storage space sometime during execution. Although only first and second processes are shown, it is understood that any number of a plurality of processes may be executing substantially concurrently on a computer system, and each of the plurality of processes may at sometime request disk space use. Moreover, consumption processes 20 may request disk space usage at separate moments in time or substantially concurrently in reference with time. A pool of disk space 25 represents the storage space that is available to be allocated by consumption processes 20 upon request by such processes, or that has been allocated by such processes. This pool may comprise (1) inefficiently used disk space, (2) usable (free) disk space, (3) efficiently used disk space, and (4) free disk space as generated by space manager process 55. For simplicity purposes, usable (free) disk space that has not actually been generated by space manager process 55 and free disk space that has actually been generated by space manager process 55 will collectively be referred to as free disk space.

There are multiple ways of storing data which vary in terms of the amount of information stored per unit of storage space. In this context, inefficiently used disk space includes, but is not limited to, (1) fragmented disk space, (2) disk space occupied by non-compressed data, and/or (3) disk space occupied by redundant data. Initially, data may be stored inefficiently for expediency purposes. Likewise, inefficiency, such as fragmentation, may creep in as space is used and reused.

When these factors exist, it is possible for space manager process 55 to generate space by increasing the efficiency of space usage. Space manager process 55 obtains free disk space needed and inefficiently used space 60 from disk space 25 and converts it to efficiently used space and at least the same amount of free space 65, or more, as was initially obtained. This is accomplished by defragmenting the disk space, compressing the data as needed, altering the redundancy scheme, or by performing any other action upon the disk that will free up more space as necessary, such as deleting old files tagged accordingly. See FIG. 3 and its description for further details on these variations of converting inefficiently used space to efficiently used space.

Space manager process 55 may initiate action on its own to create free disk space when it determines such is needed, or it may be called to create free space by a process requesting disk space consumption when an insufficient amount of disk space exists to satisfy the request. In a self-initiated context, space manager 55 makes a periodic space check 67 to determine the availability of free disk space in the pool of storage space 25. If it is determined that insufficient free disk space is available, i.e., the amount of free disk space is below a predetermined lower threshold level, space manager 55 will initiate the conversion process on its own to obtain inefficiently used space 60 and convert it to efficiently used space and free space 65. Space manager 55 will continue this self-initiated operation of generating free disk space until a predetermined, upper threshold level amount of free disk space is created.

When a process 20 makes a request for disk space consumption 30, the request is intercepted by fairness filter process 40. Fairness filter 40 provides a means for ensuring that each requesting process 20 is allowed to allocate disk space only pursuant to control of a fairness ordering scheme.

Upon receiving a request from consumption process 20 that disk space is required, fairness filter 40 identifies whether it is fair at this time for this consumer process to allocate storage space from the pool of available storage space 25. Fairness filter 40 makes this determination pursuant to the predefined fairness ordering scheme. If fairness filter 40 determines that it is permissible for consumer process 20 to allocate storage space, then the fairness filter allows the consumer process to accomplish its disk space consumption 50.

When multiple space consuming processes contend for resources, such as disk storage space, it is possible for a process which arrived after another process to obtain resources before the other, thus delaying the prior process. In some cases, this is intentional and is controlled through the use of priority indications associated with requests. Often, however, this is undesirable, in which case some means of introducing fair contention is required. When contention is fair, no process can ever wait indefinitely for its request to be fulfilled, regardless of other requests that may arrive.

In the preferred embodiment, logic determines the order in which competing consumers are allowed to allocate storage space according to the fairness ordering scheme, with the idea in mind that no request for space is unduly delayed relative to a competing request. For example, assume that the ordering scheme is a first-in-first-out (FIFO) scheme and that space manager process 55 is executing in a background mode to generate more usable free disk space from inefficiently used space. Assume also that first space consuming process 22 requests to consume disk space but is unable to allocate its required amount because space manager process 55 is still executing and has not yet generated enough free space for first process 22 to consume, or has not generated sufficient free space to satisfy the upper threshold level. Assume also, then, that second process 24 contends for consumption of disk space substantially concurrently with but immediately after first process 22 has made its request.

In this scenario, it is possible for space manager process 55 to finish generating sufficient free space just as second process 24 requests space. However, fairness filter 40 ensures that first process 22 allocates its requested amount before second process 24 is allowed to allocate its requested amount, under control of the FIFO fairness ordering scheme implemented. In essence, a contention for space occurs, but first process 22 is able to allocate its required space without concern for second process 24 unfairly consuming the space because of the control of fairness filter 40 and the fairness ordering scheme. If it were not for fairness filter 40, second process 24 could unfairly allocate and consume the free space generated by space manager process 55 before first process 22 could allocate its requested amount, even though first process 22 was first in time to request space.

Accordingly, fairness filter 40 ensures that each consuming process 20 takes its appropriate turn at allocating disk space by following a set ordering scheme, such as FIFO. Although FIFO is mentioned here, it by no means is the only scheme available. It is given that any scheme or combination of schemes is usable so long as it satisfies the priority and fairness requirements deemed pertinent for the system.

If fairness filter 40 determines that it is fair for consumer process 20 to allocate space and consumer process 20 is allowed to allocate disk space, the consumer process allocates space as it normally would. If sufficient space exists such that the request for space is satisfied, then the space is allocated and the process continues on in its normal manner of execution. In contrast, if the consuming process attempts to allocate space but an I/O error signal results because there is insufficient disk storage space available to satisfy the consumption request, then space manager process 55 intercepts the I/O error and responds accordingly to free up some disk space to satisfy the consumer request. It should be noted that space manager 55 is not subject to the constraints of fairness filter 40 and is able to obtain (consume) disk space as necessary in order to perform its function of generating more free space for consuming processes 20.

One of the novel aspects of this system is the ability of each of the depicted events to occur substantially concurrently with the others. In other words, for example, second space consuming process 24 may make a request for space consumption 30 at substantially the same time that fairness filter 40 is allowing first consuming process 22 to allocate and consume storage space 50 and, at the same time, that space manager 55 is generating free disk space to satisfy the consumption request of first process 22. In this concurrent processing context, second process 24 cannot steal space from first process 22, even while space manager 55 is generating free space for first process 22, because of fairness filter 40 and the implemented ordering scheme.

Figure 2:
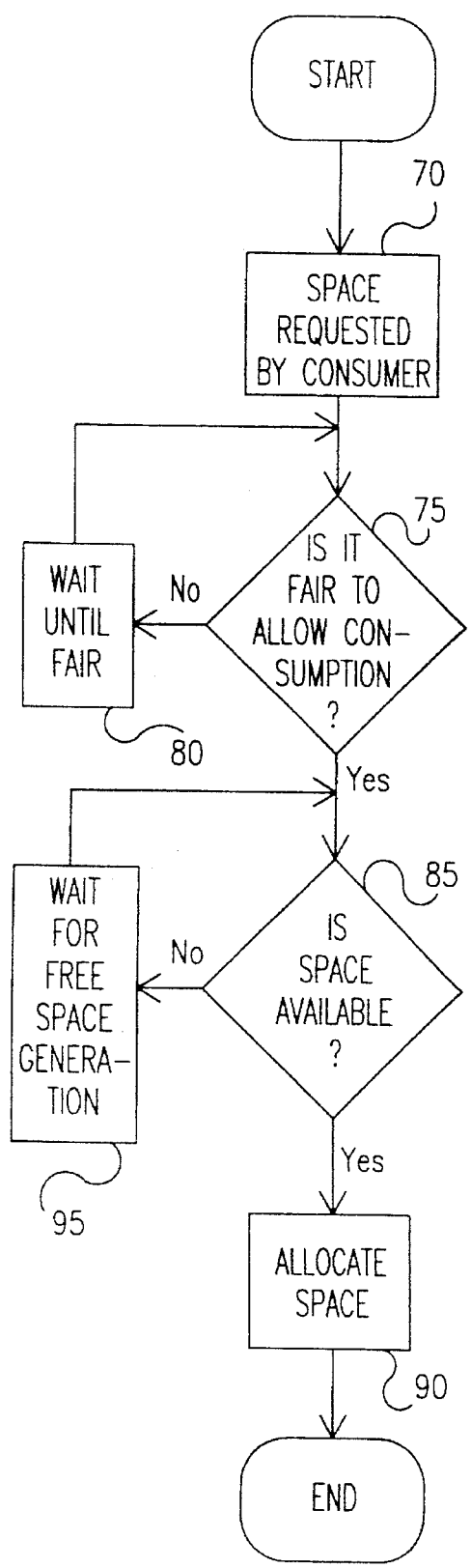
FIG. 2 is a flow chart depicting the steps involved with a space consumer process in allocating disk space pursuant to control of a fairness filter scheme.

Referring now to FIG. 2, a flow chart depicts the steps involved with a space consumer process in allocating disk space pursuant to control of fairness filter scheme 40 (of FIG. 1 ). When a consumer requests consumption or allocation of disk space 70, fairness filter 40 immediately determines whether it is fair to allow the consumer to allocate space pursuant to the prescribed fairness ordering scheme 75. If it is not fair for this process to allocate disk space at this moment, then satisfaction of the request is postponed 80 until a later moment. For example, in a FIFO scheme, if a prior process previously requested disk space but has not yet finished allocating its total amount, the currently requesting process must wait.

However, if it is fair to allow the requesting consumer to allocate space, then the consuming process is allowed to proceed with allocation of the space. If there is sufficient disk space available 85, the process then allocates its necessary space 90 and uses it pursuant to its individual processing requirements. On the other hand, if sufficient disk space is not available, an I/O error is generated (by the standard disk I/O control software and hardware) and is intercepted by space manager 55 (of FIG. 1 ), and the consuming process must wait 95 until sufficient free space is generated by space manager 55. As a result of intercepting the error signal, space manager 55 will later signal (notify) the requesting consumer when sufficient free space has been generated to satisfy the request.

Any other processes requesting disk space may be required to wait for the current process to allocate its requested space pursuant to the fairness filter scheme. Only when the current process satisfies its request will fairness filter 40 allow another process to also allocate space.

Figure 3:
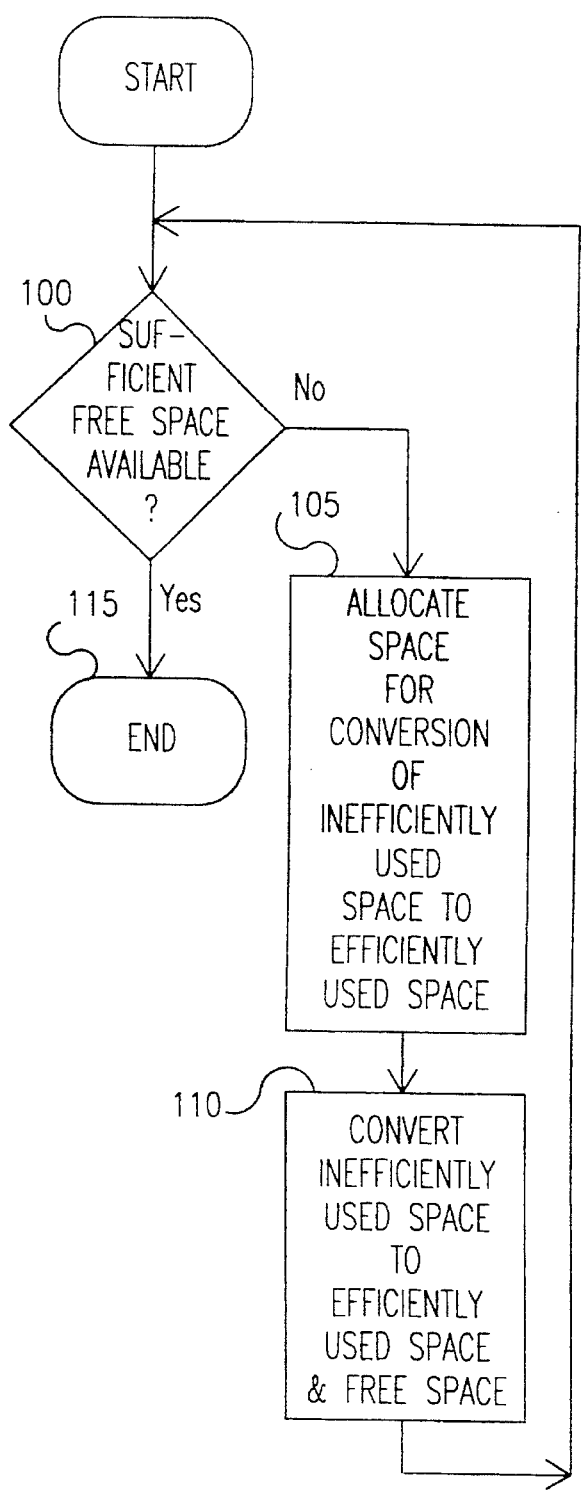
FIG. 3 is a flow chart depicting the steps taken by a storage space manager for converting inefficiently used storage space to efficiently used storage space and free space.

Referring now to FIG. 3, another flow chart depicts the steps taken by storage space manager 55 (of FIG. 1) for converting inefficiently used storage space to efficiently used storage space and free space. As previously discussed, the space manager is activated when it is determined that insufficient usable free disk space exists and more usable disk storage space is needed 100. For example, space manager 55 may be self-activated at predetermined moments to consistently keep the disk storage space used efficiently and to retain sufficient free space available. The moment in which space manager 55 may self-initiate a check for sufficiency of disk space is governed by time period data and a time data-stream indicative of time passage as generated by a clock. The time period data is predefined and/or dynamically generated by conventional means in the art, and is indicative of a time or recurring time when space manager 55 may self-initiate a check for sufficiency of disk space. The time data-stream is generated by any conventional clock means in the art. The time period data is referenced against the time-data stream for determination of whether a check for sufficiency of disk space is appropriate. Alternatively, the space manager may be activated to create free disk space when a consuming process attempts to allocate more space than exists, and a respective I/O error signal is generated and intercepted by the space manager.

However, regardless of the means by which the manager is activated 100, its first step is to allocate and obtain storage space for its own use 105 for converting any inefficiently used space to efficiently used space and free space. In this context, the manager is not subject to the control of fairness filter 40 (FIG. 1) and its ordering scheme, and, consequently, the manager circumvents the fairness filter and retains a higher priority over other disk space consuming processes in order to accomplish its task of creating free space.

Next, the actual step of converting inefficiently used space to efficiently used space and free space occurs 110. Namely, in the case of fragmented space encountered, it is defragmented. In the case of non-compressed data encountered, it is compressed. In the case of redundant data encountered, it is converted to less redundant data. For example, data stored under the RAID I mirroring technique is converted to a RAID 5 parity check technique. Consequently, in each case, inefficiently used disk space is converted to more efficiently used disk space; and at least as much, if not more, free disk space is generated therefrom.

At this point, the space manager process may repeat its execution. Namely, it is again determined whether enough free space has been made available 100 by (1) allowing a consuming process to generate an I/O error, or (2) by allowing the space manager to self-check the sufficiency of free space available relative to the predetermined lower threshold level, or (3) by allowing the space manager to self-check at the next predetermined time interval. If enough free space has been made available, the space management process ends 115. In contrast, if insufficient free space exists, the steps are repeated 105 and 110 in order to continue to generate sufficient free space.

What has been described above are the preferred embodiments for a storage management system for the concurrent generation and fair allocation of disk space for competing disk space consumers. It is clear that the present invention provides a powerful tool for significantly improving the means for generating free disk space and for ensuring fair allocation of disk space for competing processes. Moreover, it will be obvious to one of ordinary skill in the art that the present invention is easily implemented utilizing any of a variety of hardware platforms and software tools existing in the art. While the present invention has been described by reference to specific embodiments, it will be apparent that other alternative embodiments and methods of implementation or modification may be employed without departing from the true spirit and scope of the invention.

What is claimed is:

1. A storage management system for a storage means, comprising:
   (a) sensing means for sensing a need for generation of free storage space in the storage means;
   (b) generating means for generating the free storage space responsive to the sensing means, wherein the free storage space is generated from inefficiently used storage space in the storage means; and,
   (c) control means for controlling allocation of the free storage space in the storage means according to an allocation ordering scheme, wherein the allocation is requested by competing storage space consumers and the control means allows the competing consumers to allocate requested amounts of storage space at moments in time determined by indicia identified by the allocation ordering scheme.

2. The storage management system of claim 1 wherein the sensing means includes a means for sensing that an insufficient quantity of the free storage space is available to satisfy a predetermined threshold level.

3. The storage management system of claim 1 wherein the sensing means includes a means for sensing an insufficient storage space I/O error signal generated by an inability of the storage means to satisfy the allocation requested by the storage space consumer.

4. The storage management system of claim 1 further including time period data for periodically checking whether an insufficient amount of the free storage space exists in the storage means, and a clock means for generating a time data-stream indicative of time passage, and wherein the sensing means further includes a means for determining whether an insufficient amount of the free storage space exists on the storage means at intervals determined from the time period data and the time data-stream.

5. The storage management system of claim 1 wherein the generating means operates independent of and not subject to the control means, and wherein the generating means allocates storage space by circumventing the allocation ordering scheme.

6. The storage management system of claim 1 wherein the generating means includes a means for converting the inefficiently used storage space to efficiently used storage space and the free storage space.

7. The storage management system of claim 1 wherein the inefficiently used storage space includes storage space selected from the group consisting of storage space occupied by compressible data, storage space occupied by redundant data, and fragmented storage space.

8. The storage management system of claim 7 wherein the generating means includes a means selected from the group consisting of:
   (a) a means for compressing the compressible data;
   (b) a means for converting the redundant data to a lesser amount of redundant data through implementation of an alternate data redundancy technique; and,
   (c) a means for defragmenting the fragmented storage space, to obtain the efficiently used storage space and the free storage space therefrom.

9. The storage management system of claim 1 wherein the allocation ordering scheme includes an element of fairness for controlling the allocation of the free storage space by the competing requesting storage space consumers.

10. The storage management system of claim 1 wherein the allocation ordering scheme is a first in first out (FIFO) scheme.

11. A method of managing storage space in a storage means, comprising the steps of:
   (a) sensing a need for generation of free storage space in the storage means;
   (b) generating the free storage space from inefficiently used storage space in the storage means; and,
   (c) controlling allocation of the free storage space in the storage means according to an allocation ordering scheme, wherein the allocation is requested by competing storage space consumers and the competing consumers allocate requested amounts of storage space at moments in time determined by indicia identified by the allocation ordering scheme.

12. The method of claim 11 wherein the step of sensing includes sensing that an insufficient quantity of the free storage space is available to satisfy a predetermined threshold level.

13. The method of claim 11 wherein the step of sensing includes sensing an insufficient storage space I/O error signal generated by an inability of the storage means to satisfy the allocation requested by the storage space consumer.

14. The method of claim 11 wherein the sensing further includes determining whether an insufficient amount of the free storage space exists on the storage means at intervals determined from a time period data and a time data-stream generated by a clock signal.

15. The method of claim 11 wherein the step of generating occurs independent of and not subject to the control means and the allocation ordering scheme.

16. The method of claim 11 wherein the step of generating includes converting the inefficiently used storage space to efficiently used storage space and the free storage space.

17. The method of claim 11 wherein the inefficiently used storage space includes storage space selected from the group consisting of storage space occupied by compressible data, storage space occupied by redundant data, and fragmented storage space.

18. The method of claim 17 wherein the step of generating is selected from the group consisting of:

(a) compressing the compressible data;

(b) converting the redundant data to a lesser amount of redundant data through implementation of an alternate data redundancy technique; and, (c) defragmenting the fragmented storage space, to obtain the efficiently used storage space and the free storage space therefrom.

19. The method of claim 11 wherein the allocation ordering scheme includes an element of fairness for controlling the allocation of the free storage space by the competing requesting storage space consumers.

20. The method of claim 11 wherein the allocation ordering scheme is a first-in-first-out (FIFO) scheme.

* * * * *